(12) United States Patent
Yoshinaka et al.

(10) Patent No.: US 11,009,574 B2
(45) Date of Patent: May 18, 2021

(54) COIL ARRAY COMPONENT

(71) Applicant: Murata Manufacturing Co., Ltd., Kyoto-fu (JP)

(72) Inventors: Keiichi Yoshinaka, Nagaokakyo (JP); Katsuhisa Imada, Nagaokakyo (JP); Mitsuhiro Sato, Nagaokakyo (JP); Ryohei Kawabata, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 16/510,613

(22) Filed: Jul. 12, 2019

(65) Prior Publication Data
US 2020/0033428 A1 Jan. 30, 2020

(30) Foreign Application Priority Data
Jul. 25, 2018 (JP) .............................. JP2018-139432

(51) Int. Cl.
*G01V 3/00* (2006.01)
*G01R 33/36* (2006.01)
*G01R 33/341* (2006.01)

(52) U.S. Cl.
CPC ........... *G01R 33/36* (2013.01); *G01R 33/341* (2013.01)

(58) Field of Classification Search
CPC .. G01R 33/441; G01R 33/3415; G01N 24/08; G01N 24/084; B82Y 10/00
(Continued)

(56) References Cited

U.S. PATENT DOCUMENTS

| 5,321,573 A * | 6/1994 | Person | H02H 9/044 |
| | | | 361/111 |
| 2003/0231457 A1* | 12/2003 | Ritter | C23C 18/32 |
| | | | 361/306.3 |

(Continued)

FOREIGN PATENT DOCUMENTS

| JP | H08-088126 A | 4/1996 |
| JP | H08-130109 A | 5/1996 |

(Continued)

OTHER PUBLICATIONS

An Office Action; "Notice of Reasons for Refusal," mailed by the Japanese Patent Office dated Feb. 2, 2021, which corresponds to Japanese Patent Application No. 2018-139432 and is related to U.S. Appl. No. 16/510,613 with English language translation.

(Continued)

*Primary Examiner* — Walter L Lindsay, Jr.
*Assistant Examiner* — Frederick Wenderoth
(74) *Attorney, Agent, or Firm* — Studebaker & Brackett PC

(57) ABSTRACT

A coil array component including an element assembly that includes a filler and a resin material, a first coil portion and a second coil portion that are embedded in the element assembly and that are composed of a first coil conductor and a second coil conductor, respectively, and four outer electrodes electrically connected to the first coil portion and the second coil portion. Also, four extension electrodes that extend from end surfaces of the element assembly to the bottom surface and are electrically connected to the outer electrodes on the bottom surface are further included. In addition, the extension electrodes are covered with insulating layers on end surfaces of the element assembly.

20 Claims, 13 Drawing Sheets

(58) Field of Classification Search
USPC .......................................................... 324/300
See application file for complete search history.

(56) References Cited

U.S. PATENT DOCUMENTS

| | | | |
|---|---|---|---|
| 2014/0014732 A1* | 1/2014 | Finn ................. | G06K 19/07756 235/492 |
| 2014/0028430 A1* | 1/2014 | Lee .................... | H01F 17/0013 336/200 |
| 2014/0139309 A1* | 5/2014 | Son .................... | H01F 27/2804 336/200 |
| 2016/0225513 A1* | 8/2016 | Park ................... | H01F 17/0013 |
| 2016/0258069 A1* | 9/2016 | Nesbitt ................ | C25B 1/003 |
| 2016/0379750 A1 | 12/2016 | Hamada et al. | |
| 2017/0323725 A1 | 11/2017 | Iso et al. | |
| 2017/0330675 A1 | 11/2017 | Sim et al. | |
| 2018/0122563 A1 | 5/2018 | Matsuura et al. | |

FOREIGN PATENT DOCUMENTS

| | | |
|---|---|---|
| JP | 2006-351962 A | 12/2006 |
| JP | 2007-109977 A | 4/2007 |
| JP | 2013-175505 A | 9/2013 |
| JP | 2015-073052 A | 4/2015 |
| JP | 2017-011185 A | 1/2017 |
| JP | 2017-208525 A | 11/2017 |
| JP | 2018-074043 A | 5/2018 |
| WO | 2016/121575 A1 | 8/2016 |

OTHER PUBLICATIONS

An Office Action; "Notice of Reasons for Refusal," mailed by the Japanese Patent Office dated Feb. 2, 2021, which corresponds to Japanese Patent Application No. 2018-139430 and is related to U.S. Appl. No. 16/510,613 with English language translation.

* cited by examiner

COIL ARRAY COMPONENT

CROSS-REFERENCE TO RELATED APPLICATION

This application claims benefit of priority to Japanese Patent Application No. 2018-139432, filed Jul. 25, 2018, the entire content of which is incorporated herein by reference.

BACKGROUND

Technical Field

The present disclosure relates to a coil array component.

Background Art

A coil array component in which an insulating material is interposed between a primary coil and a secondary coil is known as a coil component in which two coils are embedded in an element assembly, that is, a so-called coil array component, as described, for example, in Japanese Unexamined Patent Application Publication No. 8-88126. Such a coil array component has outer electrodes on end surfaces.

In the above-described coil array component, the outer electrodes are present on the end surfaces and, therefore, it is necessary to ensure sufficient distance between adjacent components to avoid the occurrence of short circuit during mounting. Consequently, high-density mounting is difficult.

SUMMARY

Therefore, the present disclosure provides a coil array component that provides an advantage in high-density mounting.

According to preferred embodiments of the present disclosure, the following aspects are included:

(1) A coil array component including an element assembly that includes a filler and a resin material, a first coil portion and a second coil portion that are embedded in the element assembly and that are composed of a first coil conductor and a second coil conductor, respectively, and four outer electrodes electrically connected to the first coil portion and the second coil portion. Also, four extension electrodes extend from end surfaces of the element assembly to the bottom surface and are electrically connected to the outer electrodes on the bottom surface are further included. In addition, the extension electrodes are covered with insulating layers on end surfaces of the element assembly.

(2) The coil array component according to (1) above, wherein the first coil portion and the second coil portion are arranged in two steps in a coil axis direction.

(3) The coil array component according to (1) or (2) above, wherein each of the extension electrodes includes a Cu plating layer.

(4) The coil array component according to any one of (1) to (3) above, wherein wherein each of the outer electrodes includes a Ni plating layer and a Sn plating layer.

(5) The coil array component according to any one of (1) to (4) above, wherein each of the insulating layers extends from an end surface of the element assembly to four surfaces adjacent to the end surface.

(6) The coil array component according to any one of (1) to (5) above, wherein the first coil conductor and the second coil conductor are covered with a glass layer.

(7) The coil array component according to any one of (1) to (6) above, wherein a ferrite layer is arranged between the first coil portion and the second coil portion.

(8) The coil array component according to any one of (1) to (7) above, wherein the coil conductor is fired and the element assembly is not fired.

Other features, elements, characteristics and advantages of the present disclosure will become more apparent from the following detailed description of preferred embodiments of the present disclosure with reference to the attached drawings.

DETAILED DESCRIPTION

The coil array component according to embodiments of the present disclosure will be described below in detail with reference to the drawings. In this regard, the shapes, arrangements, and the like of the coil array component and constituent elements of the present embodiment are not limited to the examples illustrated.

Figure 1:
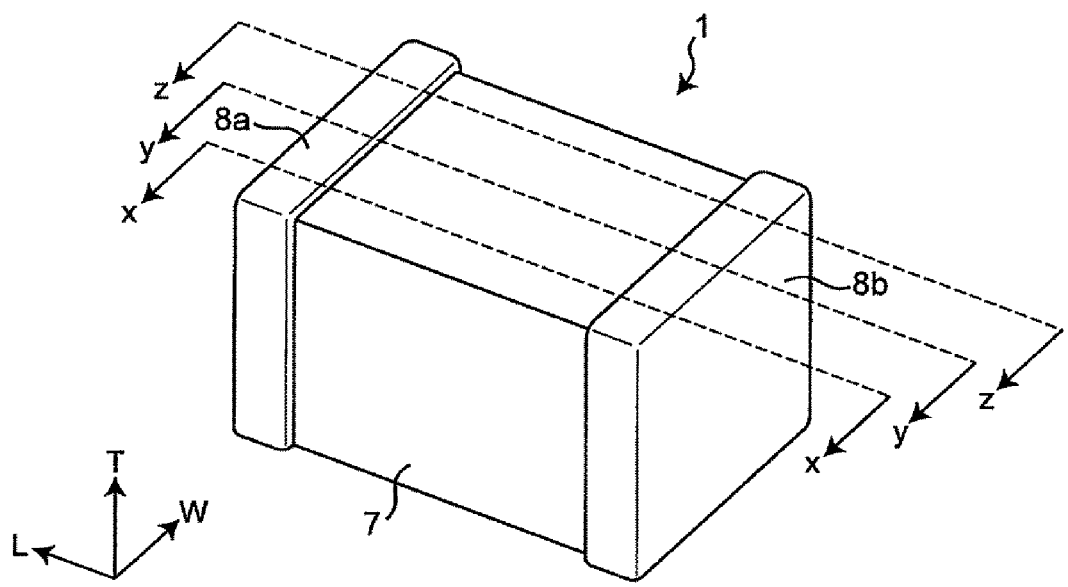
FIG. 1 is a perspective view of a coil array component according to an embodiment of the present disclosure.
Figure 2:
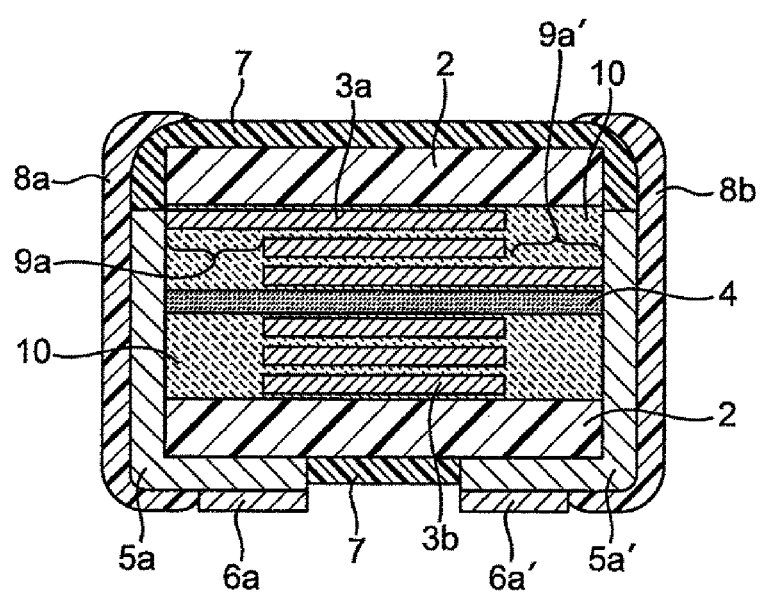
FIG. 2 is a sectional view showing a cut surface along line x-x of the coil array component in FIG. 1.
Figure 3:
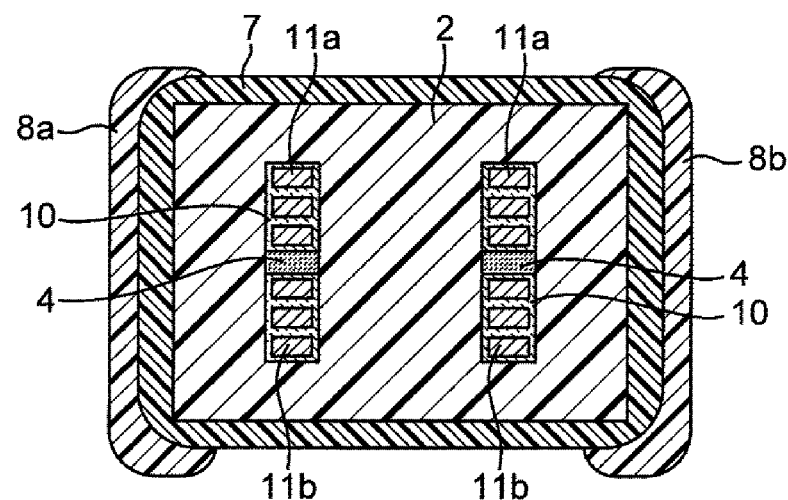
FIG. 3 is a sectional view showing a cut surface along line y-y of the coil array component in FIG. 1.
Figure 4:
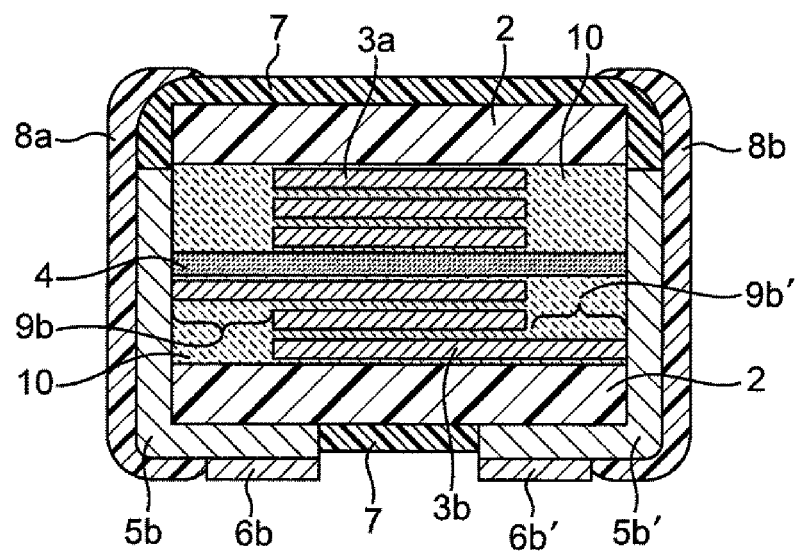
FIG. 4 is a sectional view showing a cut surface along line z-z of the coil array component in FIG. 1.
Figure 5:
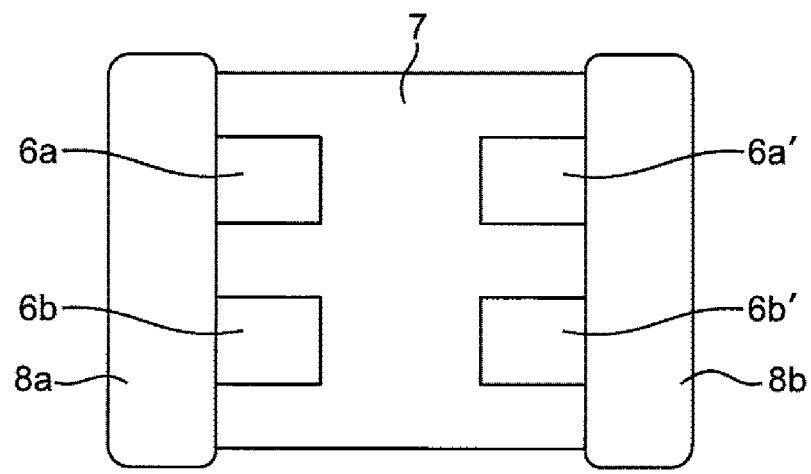
FIG. 5 is a plan view of the bottom surface of the coil array component in FIG. 1.

FIG. 1 is a schematic perspective view of a coil array component 1 according to the present embodiment, FIGS. 2 to 4 are schematic sectional views along lines x-x, y-y, and z-z, respectively, and FIG. 5 is a schematic plan view of the bottom surface (surface on which outer electrodes are present). However, the shapes, arrangements, and the like of the coil array component and constituent elements of the embodiment described below are not limited to the examples illustrated.

As shown in FIG. 1, the coil array component 1 according to the present embodiment is in the shape of a substantially rectangular parallelepiped. In the coil array component 1, the surfaces in the right and left portions of FIGS. 2 to 4 are denoted as "end surfaces", the surface in the upper portion of each of FIGS. 2 to 4 is denoted as an "upper surface", the surface in the lower portion of each of FIGS. 2 to 4 is denoted as a "lower surface" or "bottom surface", the surface in the near portion of each of FIGS. 2 to 4 is denoted as a "front surface", and the surface in the far portion of each of FIGS. 2 to 4 is denoted as a "back surface".

Regarding the coil array component 1, length is denoted as "L", width is denoted as "W", and thickness (height) is denoted as "T" (refer to FIG. 1). In the present specification, the surface parallel to the front surface and the back surface is denoted as the "LT surface", the surface parallel to the end surface is denoted as the "WT surface", and the surface parallel to the upper surface and the lower surface is denoted as the "LW surface".

Briefly, the coil array component 1 includes an element assembly 2, a first coil portion 3a and a second coil portion 3b embedded in the element assembly 2, and a ferrite layer 4. Further, the coil array component 1 includes four extension electrodes 5a, 5a', 5b, and 5b', four outer electrodes 6a, 6a', 6b, and 6b', a protective layer 7, and insulating layers 8a and 8b outside the element assembly 2. The first coil portion 3a and the second coil portion 3b are formed by winding the first coil conductor 11a and the second coil conductor 11b, respectively, into the shape of a coil. The first coil portion 3a and the second coil portion 3b are arranged in two steps on the same axis in the T-direction of the coil array component 1. The first coil portion 3a has extension portions 9a and 9a', the extension portions 9a and 9a' are electrically connected to the extension electrodes 5a and 5a', respectively, and the extension electrodes 5a and 5a' are electrically connected to the outer electrodes 6a and 6a', respectively. Likewise, the second coil portion 3b has extension portions 9b and 9b', the extension portions 9b and 9b' are electrically connected to the extension electrodes 5b and 5b', respectively, and the extension electrodes 5b and 5b' are electrically connected to the outer electrodes 6b and 6b', respectively. The first coil conductor 11a and the second coil conductor 11b are covered with a glass layer 10. The ferrite layer 4 is arranged between the first coil portion 3a and the second coil portion 3b so as to overlap the glass layer covering the first coil conductor 11a and the glass layer covering the second coil conductor 11b when viewed in the coil axis direction. The extension electrodes 5a and 5a' are arranged in the shape of substantially the letter L that extends from the end surface to the lower surface, electrically connected to the extension portions 9a and 9a', respectively, of the first coil portion 3a on the end surface, and electrically connected to the outer electrodes 6a and 6a', respectively, on the lower surface. Likewise, the extension electrodes 5b and 5b' are arranged in the shape of substantially the letter L that extends from the end surface to the lower surface, electrically connected to the extension portions 9b and 9b', respectively, of the second coil portion 3b on the end surface, and electrically connected to the outer electrodes 6b and 6b', respectively, on the lower surface. Meanwhile, the coil array component 1, except for regions in which the extension electrodes 5a, 5a', 5b, and 5b' are present, is covered with the protective layer 7. Further, both end surfaces of the coil array component 1 are covered with the insulating layers 8a and 8b.

The element assembly 2 is composed of a composite material containing a filler and a resin material. There is no particular limitation regarding the resin material. Examples of the resin material include thermosetting resins, for example, epoxy resins, phenol resins, polyester resins, polyimide resins, and polyolefin resins. One type of the resin material may be used alone, or at least two types may be used.

The filler is preferably metal particles, ferrite particles, or glass particles and more preferably metal particles. One type of the filler may be used alone, or a plurality of types may be used in combination.

According to an aspect, the filler has an average particle diameter of preferably about 0.5 µm or more and 30 µm or less (i.e., from about 0.5 µm to 30 µm), and more preferably about 0.5 µm or more and 10 µm or less (i.e., from about 0.5 µm to 10 µm). Setting the average particle diameter of the filler to be about 0.5 µm or more enables the filler to be readily handled. Meanwhile, setting the average particle diameter of the filler to be about 30 µm or less enables the filling ratio of the filler to be increased and enables the characteristics of the filler to be more effectively obtained. For example, in the case in which the filler is metal particles, the magnetic characteristics are improved.

The average particle diameter is calculated from the equivalent circle diameter of the filler in a scanning electron microscope (SEM) image of the cross section of the element assembly. For example, the average particle diameter can be obtained by taking SEM photographs of a plurality of (for example, five) regions (for example, 130 µm×100 µm) in a cross section obtained by cutting the coil array component 1, analyzing the resulting SEM images by using image analysis software (for example, Azokun (registered trademark) produced by Asahi Kasei Engineering Corporation) so as to determine the equivalent circle diameter of 500 or more metal particles, and calculating the average thereof.

There is no particular limitation regarding the metal material that constitutes the metal particles. Examples of the metal material include iron, cobalt, nickel, and gadolinium and an alloy of at least one of these. Preferably, the metal material is iron or an iron alloy. Iron may be iron only or an iron derivative, for example, a complex. There is no particular limitation regarding such an iron derivative, and examples of the iron derivative include iron carbonyl, which is a complex of iron and CO, and preferably iron pentacarbonyl. In particular, a hard-grade iron carbonyl (for example, a hard-grade iron carbonyl produced by BASF) having an onion skin structure (structure in which concentric-sphere-shaped layers are formed around the center of a particle) is preferable. There is no particular limitation regarding the iron alloy, and examples of the iron alloy include Fe—Si-based alloys, Fe—Si—Cr-based alloys, Fe—Si—Al-based alloys, Ne—Ni-based alloys, Fe—Co-based alloys, and Fe—Si—B—Nb—Cu-based alloys. The above-described alloys may further contain B, C, and the like as other secondary components. There is no particular limitation regarding the content of the secondary component, and the content may be, for example, about 0.1% by weight or more and 5.0% by weight or less (i.e., from about 0.1% by weight to 5.0% by weight) and preferably about 0.5% by weight or more and 3.0% by weight or less (i.e., from about 0.5% by weight or more and 3.0% by weight). One type of the metal material may be used alone, or at least two types may be used.

The surfaces of the metal particles may be covered with a coating of an insulating material (hereafter also referred to simply as an "insulating coating"). The specific resistance of the inside of the element assembly can be increased by covering the surfaces of the metal particles with the insulating coating.

The surface of each metal particle may be covered with the insulating coating to the extent that the insulation performance between the particles can be enhanced, and part of the surface of each metal particle may be covered with the insulating coating. There is no particular limitation regarding the form of the insulating coating, and the form of a network or a layer may be adopted. In a preferred aspect, regarding each of the metal particles, the region corresponding to about 30% or more, preferably about 60% or more, more preferably about 80% or more, further preferably about 90% or more, and particularly preferably 100% of the surface may be covered with the insulating coating.

There is no particular limitation regarding the thickness of the insulating coating. The thickness is preferably about 1 nm or more and 100 nm or less (i.e., from about 1 nm to 100 nm), more preferably about 3 nm or more and 50 nm or less (i.e., from about 3 nm to 50 nm), and further preferably about 5 nm or more and 30 nm or less (i.e., from about 5 nm to 30 nm), and may be, for example, about 5 nm or more and 20 nm or less (i.e., from about 5 nm to 20 nm). The specific resistance of the element assembly can be increased by increasing the thickness of the insulating coating. In addition, decreasing the thickness of the insulating coating enables the amount of the metal material in the element assembly to be increased, which improves the magnetic characteristics of the element assembly, readily realizing a size reduction of the coil component.

According to an aspect, the insulating coating is formed of an insulating material containing Si. Examples of the insulating material containing Si include silicon-based compounds, for example, $SiO_x$ (x is about 1.5 or more and 2.5 or less (i.e., from about 1.5 to 2.5), and $SiO_x$ is typically $SiO_2$).

According to an aspect, the insulating coating is an oxide film formed by oxidizing the surface of the metal particle. There is no particular limitation regarding the method for applying the insulating coating, and a coating method known to a person skilled in the art, for example, a sol-gel method, a mechanochemical method, a spray drying method, a fluidized-bed granulation method, an atomization method, and a barrel sputtering method, may be used.

There is no particular limitation regarding the ferrite material constituting the ferrite particles, and examples include a ferrite material containing Fe, Zn, Cu, and Ni as primary components. According to an aspect, the ferrite particles may be covered with the insulating coating in the same manner as the metal particles. The specific resistance of the inside of the element assembly can be increased by covering the surfaces of the ferrite particles with the insulating coating. There is no particular limitation regarding the glass material constituting the glass particles, and examples include Bi—B—O-based glass, V—P—O-based glass, Sn—P—O-based glass, and V—Te—O-based glass.

As shown in FIGS. 2 to 4, in the coil array component 1 according to the present embodiment, the first coil portion 3a and the second coil portion 3b are formed by winding the first coil conductor 11a and the second coil conductor 11b, respectively. Each of the first coil conductor 11a and the second coil conductor 11b is formed by stacking a plurality of conductor layers with connection portions interposed therebetween. Both ends of each of the first coil portion 3a and the second coil portion 3b are exposed at the end surfaces of the element assembly 2 by using the extension portions 9a and 9a' and the extension portions 9b and 9b', respectively, and electrically connected to the extension electrodes 5a and 5a' and the extension electrodes 5b and 5b'.

In the present embodiment, the first coil portion 3a and the second coil portion 3b are arranged in two steps with the ferrite layer 4 interposed therebetween such that both axes become perpendicular to a mounting surface and such that the axes are in accord with each other. Meanwhile, the number of turns of each of the first coil portion 3a and the second coil portion 3b of the coil array component 1 is about 2.5.

In the coil array component according to the present disclosure, there is no particular limitation regarding the arrangement of the first coil portion and the second coil portion and the number of turns, and appropriate selection may be performed in accordance with purpose. For example, it is possible that the axes of the first coil portion and the second coil portion are not in accord with each other. The first coil portion and the second coil portion may be arranged side by side in the direction parallel to the mounting surface.

There is no particular limitation regarding a conductive material constituting the coil conductors 11a and 11b, and examples of the conductive material include gold, silver, copper, palladium, and nickel. The conductive material is preferably silver or copper and more preferably silver. One type of the conductive material may be used alone, or at least two types may be used.

The thickness of each of the coil conductors 11a and 11b (thickness in the vertical direction in FIGS. 2 to 4) is preferably about 3 μm or more and 200 μm or less (i.e., from about 3 μm to 200 μm), more preferably about 5 μm or more and 100 μm or less (i.e., from about 5 μm to 100 μm), and further preferably about 10 μm or more and 100 μm or less (i.e., from about 10 μm to 100 μm). The resistance of the coil conductor can be reduced by increasing the thickness of the coil conductor. Meanwhile, the coil array component can be reduced in size by decreasing the thickness of the coil conductor.

The width of each of the coil conductors 11a and 11b (width in the lateral direction in FIGS. 2 to 4) is preferably about 5 μm or more and 1 mm or less (i.e., from about 5 μm to 1 mm), more preferably about 10 μm or more and 500 μm or less (i.e., from about 10 μm to 500 μm), further preferably about 15 μm or more and 300 μm or less (i.e., from about 15 μm to 300 μm), and still more preferably 30 μm or more and 300 μm or less (i.e., from 30 μm to 300 μm). The coil portion can be reduced in size by decreasing the width of the coil conductor, and there are advantages in size reduction of the coil array component. Meanwhile, the resistance of the conducting wire can be reduced by increasing the width of the coil conductor.

In the coil array component 1 according to the present disclosure, the coil conductors 11a and 11b are covered with a glass layer 10. In this regard, in the coil array component according to the present disclosure, the coil conductors are covered with the glass layer, but the present disclosure is not limited to this aspect. It is possible for the glass layer to be omitted.

There is no particular limitation regarding a glass material constituting the glass layer 10. Examples of the glass material include $SiO_2$—$B_2O_3$-based glass, $SiO_2$—$B_2O_3$—$K_2O$-based glass, $SiO_2$—$B_2O_3$—$Li_2O$—CaO-based glass, $SiO_2$—$B_2O_3$—$Li_2O$—CaO—ZnO-based glass, and $Bi_2O_3$—$B_2O_3$—$SiO_2$—$Al_2O_3$-based glass. In a preferred aspect, the glass material is $SiO_2$—$B_2O_3$—$K_2O$-based glass. When $SiO_2$—$B_2O_3$—$K_2O$-based glass is used, the sinterability in formation of the glass layer is enhanced.

According to an aspect, the glass layer 10 may further contain a filler. Examples of the filler contained in the glass layer include quartz, alumina, magnesia, silica, forsterite, steatite, and zirconia.

The thickness of the glass layer 10 (thickness in the vertical direction in FIG. 3) may be preferably about 3 μm or more and 30 μm or less (i.e., from about 3 μm to 30 μm), more preferably about 3 μm or more and 20 μm or less (i.e., from about 3 μm to 20 μm), and further preferably about 5 μm or more and 20 μm or less (i.e., from about 5 μm to 20 μm). Setting the thickness of the glass layer 10 to be about 3 μm or more enables the coil portion to be more firmly supported and enables the insulation performance between the coil portion and the element assembly to be enhanced. Setting the thickness of the glass layer 10 to be about 30 μm or less suppresses a reduction in inductance from occurring and enables the coil array component to be reduced in size.

The ferrite layer 4 is disposed between the first coil portion 3a and the second coil portion 3b. The coupling coefficient between the first coil portion 3a and the second coil portion 3b can be adjusted by disposing the ferrite layer 4 between the first coil portion 3a and the second coil portion 3b.

In the present embodiment, the ferrite layer 4 is arranged so as to overlap the glass layer of the first coil conductor and the glass layer of the second coil conductor when viewed in the coil axis direction.

In the coil array component according to the present disclosure, there is no particular limitation regarding the position, the form, and the like of the ferrite layer.

There is no particular limitation regarding the composition of the ferrite material that constitutes the ferrite layer 4. Preferably, Fe, Zn, Cu, and Ni may be contained as primary components. Usually, the ferrite material may be produced by mixing and calcining a predetermined ratio of powders of $Fe_2O_3$, ZnO, CuO, and NiO that serve as raw materials and that are oxides of the above-described metals, but the production method is not limited to this.

The D50 (particle diameter at a cumulative percentage of 50% on a volume basis) of the ferrite material is preferably 0.5 μm or more and 10 μm or less (i.e., from 0.5 μm to 10 μm) and more preferably 1 μm or more and 5 μm or less (i.e., from 1 μm to 5 μm).

According to an aspect, the primary components of the ferrite material are essentially composed of oxides of Fe, Zn, Cu, and Ni. In the ferrite material, the content of Fe as $Fe_2O_3$ is about 40.0% by mol or more and 49.5% by mol or less (i.e., from about 40.0% by mol to 49.5% by mol) (relative to the total primary components, the same applies hereafter) and may be preferably about 45.0% by mol or more and 49.5% by mol or less (i.e., from about 45.0% by mol to 49.5% by mol).

In the ferrite material, the content of Zn as ZnO is about 2.0% by mol or more and 45.0% by mol or less (i.e., from about 2.0% by mol to 45.0% by mol) (relative to the total primary components, the same applies hereafter) and may be preferably about 10.0% by mol or more and 30.0% by mol or less (i.e., from about 10.0% by mol to 30.0% by mol).

In the ferrite material, the content of Cu as CuO is about 4.0% by mol or more and 12.0% by mol or less (i.e., from about 4.0% by mol to 12.0% by mol) (relative to the total primary components, the same applies hereafter) and may be preferably about 7.0% by mol or more and 10.0% by mol or less (i.e., from about 7.0% by mol to 10.0% by mol).

In the above-described magnetic material, there is no particular limitation regarding the content of Ni, and the content may be the remainder of the content of the primary components, that is, the content other than the content of Fe, Zn, and Cu described above.

According to an aspect, the content of Fe as $Fe_2O_3$ is about 40% by mol or more and 49.5% by mol or less (i.e., from about 40% by mol to 49.5% by mol), the content of Zn as ZnO is about 2% by mol or more and 45% by mol or less (i.e., from about 2% by mol to 45% by mol), the content of Cu as CuO is about 4% by mol or more and 12% by mol or less (i.e., from about 4% by mol to 12% by mol), and the content of NiO is the remainder.

In the present disclosure, the ferrite material may further contain additional components. Examples of additional components in the ferrite material include Mn, Co, Sn, Bi, and Si, but the additional components are not limited to these. The content (amount of addition) of each of Mn, Co, Sn, Bi, and Si as $Mn_3O_4$, $Co_3O_4$, $SnO_2$, $Bi_2O_3$, and $SiO_2$, respectively, is preferably about 0.1 parts by weight or more and 1 part by weight or less (i.e., from about 0.1 parts by weight to 1 part by weight) relative to 100 parts by weight of the total primary components (Fe (as $Fe_2O_3$), Zn (as ZnO), Cu (as CuO), and Ni (as NiO)).

The thickness of the ferrite layer 4 (thickness in the vertical direction in FIGS. 2 to 4) is preferably about 5 μm or more and 180 μm or less (i.e., from about 5 μm to 180 μm), more preferably about 10 μm or more and 100 μm or less (i.e., from about 10 μm to 100 μm), and further preferably about 30 μm or more and 100 μm or less (i.e., from about 30 μm to 100 μm). The coupling coefficient between the first coil portion 3a and the second coil portion 3b can be adjusted by controlling the thickness of the ferrite layer 4.

In this regard, in the coil array component according to the present disclosure, the ferrite layer 4 is not indispensable and may be omitted.

The extension electrodes 5a, 5a', 5b, and 5b' are arranged in the shape of substantially the letter L that extends from the end surface to the lower surface of the element assembly 2. On the end surfaces of the element assembly 2, the extension electrodes 5a and 5a' and the extension electrodes 5b and 5b' are electrically connected to the first coil portion 3a and the second coil portion 3b, respectively, exposed at the element assembly 2. In addition, the extension electrodes 5a, 5a', 5b, and 5b' are electrically connected to the outer electrodes 6a, 6a', 6b, and 6b', respectively, on the lower surface of the element assembly 2. When such extension electrodes are disposed, the outer electrodes can be disposed on the lower surface of the coil array component and, as a result, the coil array component 1 can be surface-mounted.

There is no particular limitation regarding the thickness of the extension electrode. For example, the thickness may be preferably about 1 μm or more and 100 μm or less (i.e., from about 1 μm to 100 μm), preferably about 5 μm or more and 50 μm or less (i.e., from about 5 μm to 50 μm), and more preferably about 5 μm or more and 20 μm or less (i.e., from about 5 μm to 20 μm).

The extension electrode may be a single layer or a multilayer. According to an aspect, the extension electrode is a single layer.

The extension electrode is composed of a conductive material, preferably at least one metal material selected from a group consisting of Au, Ag, Pd, Ni, Sn, and Cu.

According to a preferred aspect, in the extension electrode, a layer in direct contact with the element assembly 2 is composed of Cu. In further preferred aspect, the extension electrode is a single layer composed of Cu. The adhesiveness of plating serving as the extension electrode to the element assembly can be enhanced by forming a Cu layer on the element assembly 2. Preferably, the extension electrode is formed by plating.

The outer electrodes 6a, 6a', 6b, and 6b' are disposed on the extension electrodes 5a, 5a', 5b, and 5b', respectively, on the lower surface of the element assembly 2. That is, the outer electrodes 6a, 6a', 6b, and 6b' are electrically connected to the extension electrodes 5a, 5a', 5b, and 5b', respectively, on the lower surface of the element assembly 2. There is no particular limitation regarding the thickness of the outer electrode, and the thickness may be, for example, about 1 µm or more and 100 µm or less (i.e., from about 1 µm to 100 µm), preferably about 5 µm or more and 50 µm or less (i.e., from about 5 µm to 50 µm), and more preferably about 5 µm or more and 20 µm or less (i.e., from about 5 µm to 20 µm).

The outer electrode may be a single layer or a multilayer. According to an aspect, the outer electrode is a multilayer, preferably two layers. The outer electrode is composed of a conductive material, preferably at least one metal material selected from a group consisting of Au, Ag, Pd, Ni, Sn, and Cu. According to a preferred aspect, the metal material is Ni and Sn. According to a further preferred aspect, the outer electrode is composed of a Ni layer formed on the extension electrode and a Sn layer formed thereon. Preferably, the outer electrode is formed by plating.

The coil array component 1 except portions in which the extension electrodes are present is covered with a protective layer 7.

There is no particular limitation regarding the thickness of the protective layer 7, and the thickness is preferably about 2 µm or more and 20 µm or less (i.e., from about 2 µm to 20 µm), more preferably about 3 µm or more and 10 µm or less (i.e., from about 3 µm to 10 µm), and further preferably about 3 µm or more and 8 µm or less (i.e., from about 3 µm to 8 µm). Setting the thickness of the insulating layer to be within the above-described range enables an increase in size of the coil array component 1 to be suppressed and, in addition, enables the insulation performance of the surface of the coil array component 1 to be ensured.

Examples of the insulating material constituting the protective layer 7 include resin materials having high electric insulation performance such as acrylic resins, epoxy resins, and polyimide resins.

In the coil array component according to the present disclosure, the protective layer 7 is not indispensable and may be omitted.

Two end surfaces of the coil array component 1 according to the present embodiment are covered with the insulating layers 8a and 8b. Covering the end surfaces of the coil array component 1 with the insulating layers 8a and 8b enables high-density mounting on the substrate to be facilitated.

There is no particular limitation regarding the thickness of each of the insulating layers 8a and 8b, and the thickness may be preferably about 3 µm or more and 20 µm or less (i.e., from about 3 µm to 20 µm), more preferably about 3 µm or more and 10 µm or less (i.e., from about 3 µm to 10 µm), and further preferably about 3 µm or more and 8 µm or less (i.e., from about 3 µm to 8 µm). Setting the thickness of the insulating layer to be within the above-described range enables an increase in size of the coil array component 1 to be suppressed and, in addition, enables the insulation performance of the surface of the coil array component 1 to be ensured.

Examples of the insulating material constituting the insulating layers 8a and 8b include resin materials having high electric insulation performance such as acrylic resins, epoxy resins, and polyimide resins.

In the coil array component according to the present disclosure, the insulating layers 8a and 8b are not indispensable and may be omitted.

The coil array component according to the present disclosure can be reduced in size while having excellent electric characteristics. According to an aspect, the length (L) of the coil array component according to the present disclosure is preferably about 1.45 mm or more and 3.4 mm or less (i.e., from about 1.45 mm to 3.4 mm). According to an aspect, the width (W) of the coil array component according to the present disclosure is preferably about 0.65 mm or more and 1.8 mm or less (i.e., from about 0.65 mm to 1.8 mm). According to a preferred aspect, regarding the coil array component according to the present disclosure, the length (L) may be about 3.2±0.2 mm and the width (W) may be about 1.6±0.2 mm. Preferably, the length (L) may be about 2.0±0.2 mm and the width (W) may be about 1.25±0.2 mm. More preferably, the length (L) may be about 1.6±0.15 mm and the width (W) may be about 0.8±0.15 mm. According to an aspect, the height (or thickness (T)) of the coil array component according to the present disclosure is preferably about 1.2 mm or less, more preferably about 1.0 mm or less, and further preferably about 0.7 mm or less.

Next, a method for manufacturing the coil array component 1 will be described.

Production of Magnetic Sheet (Element Assembly Sheet)

Metal particles (filler) and a resin material are prepared. The metal particles and other filler components (a glass powder, a ceramic powder, a ferrite powder, and the like), as the situation demands, are wet-mixed with the resin material so as to form a slurry, a sheet having a predetermined thickness is formed by using a doctor blade method or the like, and drying is performed. In this manner, a magnetic sheet of a composite material of the metal particles and the resin material is produced.

Photosensitive Conductor Paste

Conductive particles, for example, a Ag powder is prepared. A predetermined amount of the conductive particles are mixed with a varnish prepared by mixing a solvent and an organic component so as to produce a photosensitive conductor paste.

Photosensitive Glass Paste

A glass powder is prepared. A predetermined amount of the glass powder is mixed with a varnish prepared by mixing a solvent and an organic component so as to produce a photosensitive glass paste.

Photosensitive Ferrite Paste

A ferrite material is prepared. For example, oxides and the like of iron, nickel, zinc, and copper that serve as raw materials are mixed, calcined at a temperature of about 700° C. to 800° C., pulverized by a ball mill or the like, and dried so as to obtain a ferrite material that is an oxide mix powder. The resulting ferrite material is mixed into a vanish prepared by mixing a solvent and an organic component so as to produce a photosensitive ferrite paste.

Shape-Retaining Photosensitive Paste

A material that disappears at a firing stage and, as the situation demands, an inorganic material powder that does not sinter at a firing stage are prepared. Examples of the material that disappears at a firing stage include an organic material, preferably the above-described varnish. Examples of the above-described inorganic material include a ceramic powder, for example, alumina. The D50 of the inorganic material is preferably about 0.1 µm or more and 10 µm or less (i.e., from about 0.1 µm to 10 µm). A predetermined amount of the inorganic material powder that does not sinter at a firing stage is mixed with a varnish prepared by mixing a solvent and an organic component so as to produce a shape-retaining photosensitive paste.

Production of Element

Figure 6A:
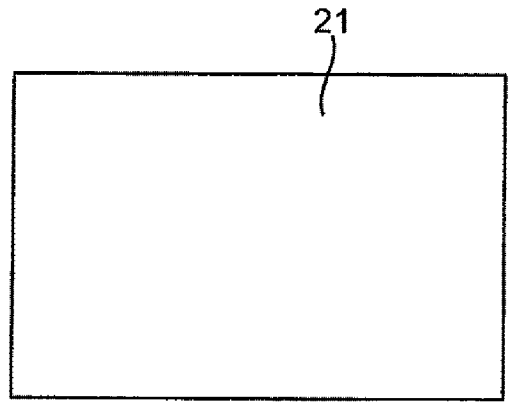
FIGS. 6A to 6C are plan views illustrating a method for manufacturing the coil array component according to an embodiment.

A sintered ceramic substrate 21 is prepared as a substrate (FIG. 6A).

Figure 6B:
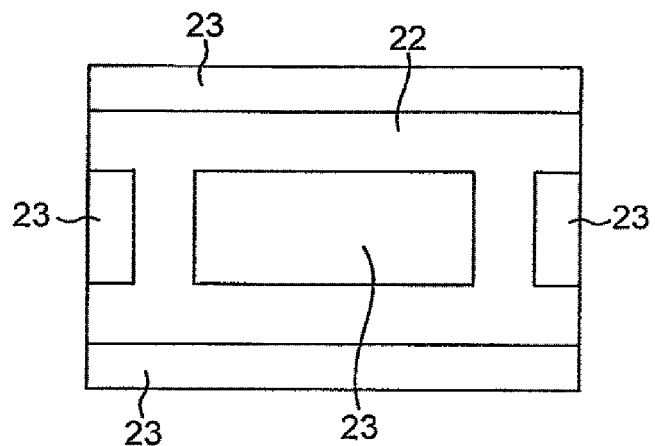

A glass paste layer 22 is formed of the photosensitive glass paste on the substrate 21 by using a photolithography method. Specifically, the glass paste layer 22 is formed by applying the photosensitive glass paste, performing photo-curing through a mask, and performing development (FIG. 6B). Subsequently, a shape-retaining paste layer 23 is formed of the shape-retaining photosensitive paste in the periphery of the glass paste layer 22 by using the photolithography method. Specifically, the shape-retaining paste layer 23 is formed in the periphery of the glass paste layer 22 by applying the shape-retaining photosensitive paste, performing photo-curing through a mask, and performing development (FIG. 6B). As the situation demands, the glass paste layer 22 and the shape-retaining paste layer 23 having predetermined thicknesses may be formed by repeating this procedure.

Figure 6C:
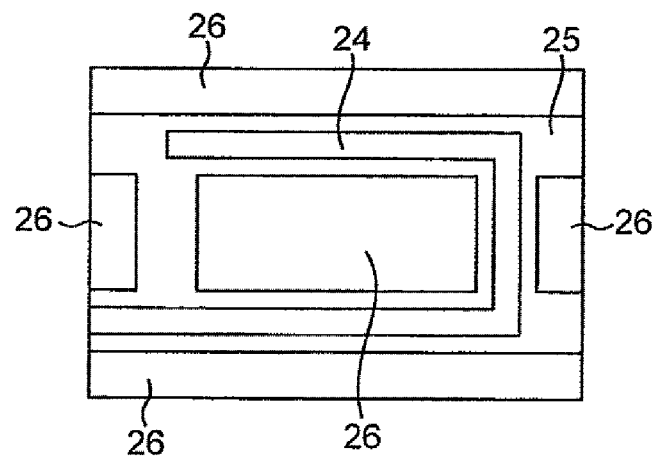

A conductor paste layer 24 is formed on the glass paste layer 22 by using the photolithography method. Specifically, the conductor paste layer 24 is formed by applying the photosensitive conductor paste, performing photo-curing through a mask, and performing development (FIG. 6C). The conductor paste layer 24 is formed inside the region of the glass paste layer 22 formed in advance. Subsequently, in the same manner as that described above, a glass paste layer 25 is formed in the periphery of the conductor paste layer 24 by applying the photosensitive glass paste, performing photo-curing through a mask, and performing development (FIG. 6C). At this time, the glass paste layer 25 is formed so as to overlap the edge portion of the conductor paste layer 24. Further, in the same manner as that described above, a shape-retaining paste layer 26 is formed in the periphery of the glass paste layer 25 by applying the shape-retaining photosensitive paste, performing photo-curing through a mask, and performing development (FIG. 6C). As the situation demands, the conductor paste layer 24, the glass paste layer 25, and the shape-retaining paste layer 26 having predetermined thicknesses may be formed by repeating this procedure.

Figure 7A:
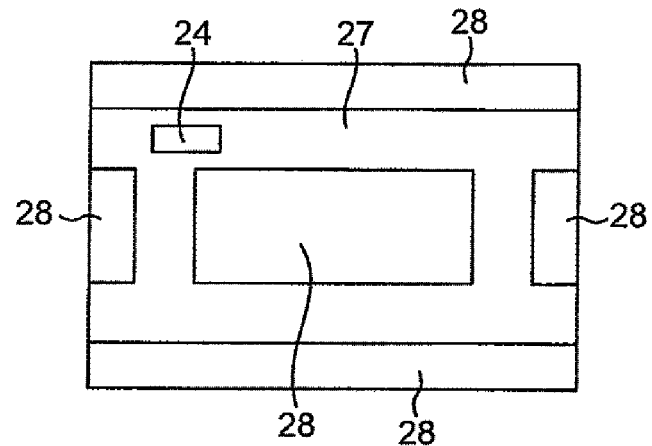
FIGS. 7A to 7C are plan views illustrating a method for manufacturing the coil array component according to an embodiment.

A glass paste layer 27 is formed on the conductor paste layer 24 by using the photolithography method. Specifically, the glass paste layer 27 is formed so as to cover the conductor paste layer 24 by applying the photosensitive glass paste, performing photo-curing through a mask, and performing development (FIG. 7A). At this time, the glass paste layer 27 is formed in the region of the conductor paste layer 24 so as to expose the region serving as a connection portion to a conductor paste layer 29 to be formed thereafter. Next, a shape-retaining paste layer 28 is formed of the shape-retaining photosensitive paste in the periphery of the glass paste layer 27 by using the photolithography method. Specifically, the shape-retaining paste layer 28 is formed in the periphery of the glass paste layer 27 by applying the shape-retaining photosensitive paste, performing photo-curing through a mask, and performing development (FIG. 7A). As the situation demands, the glass paste layer 27 and the shape-retaining paste layer 28 having predetermined thicknesses may be formed by repeating this procedure.

Figure 7B:
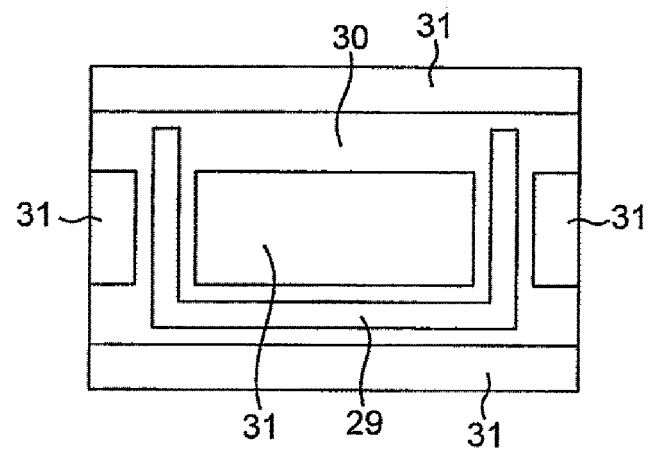

A conductor paste layer 29 is formed on the glass paste layer 27 by using the photolithography method. Specifically, the conductor paste layer 29 is formed by applying the photosensitive conductor paste, performing photo-curing through a mask, and performing development (FIG. 7B). The conductor paste layer 29 is formed inside the region of the glass paste layer 27 formed in advance. Subsequently, in the same manner as that described above, a glass paste layer 30 is formed in the periphery of the conductor paste layer 29 by applying the photosensitive glass paste, performing photo-curing through a mask, and performing development (FIG. 7B). At this time, the glass paste layer 30 is formed so as to overlap the edge portion of the conductor paste layer 29. Further, in the same manner as that described above, a shape-retaining paste layer 31 is formed in the periphery of the glass paste layer 30 by applying the shape-retaining photosensitive paste, performing photo-curing through a mask, and performing development (FIG. 7B). As the situation demands, the conductor paste layer 29, the glass paste layer 30, and the shape-retaining paste layer 31 having predetermined thicknesses may be formed by repeating this procedure.

Figure 7C:
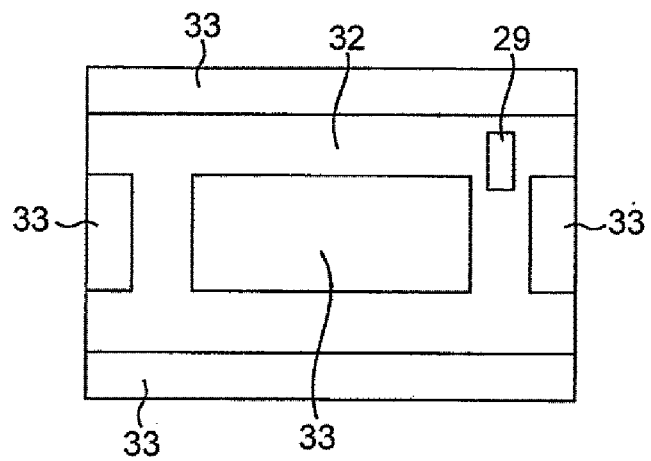

A glass paste layer 32 is formed on the conductor paste layer 29 by using the photolithography method. Specifically, the glass paste layer 32 is formed so as to cover the conductor paste layer 29 by applying the photosensitive glass paste, performing photo-curing through a mask, and performing development (FIG. 7C). At this time, the glass paste layer 32 is formed in the region of the conductor paste layer 29 so as to expose the region serving as a connection portion to a conductor paste layer 34 to be formed thereafter. Next, a shape-retaining paste layer 33 is formed of the shape-retaining photosensitive paste in the periphery of the glass paste layer 32 by using the photolithography method. Specifically, the shape-retaining paste layer 33 is formed in the periphery of the glass paste layer 32 by applying the shape-retaining photosensitive paste, performing photo-curing through a mask, and performing development (FIG. 7C). As the situation demands, the glass paste layer 32 and the shape-retaining paste layer 33 having predetermined thicknesses may be formed by repeating this procedure.

Figure 8A:
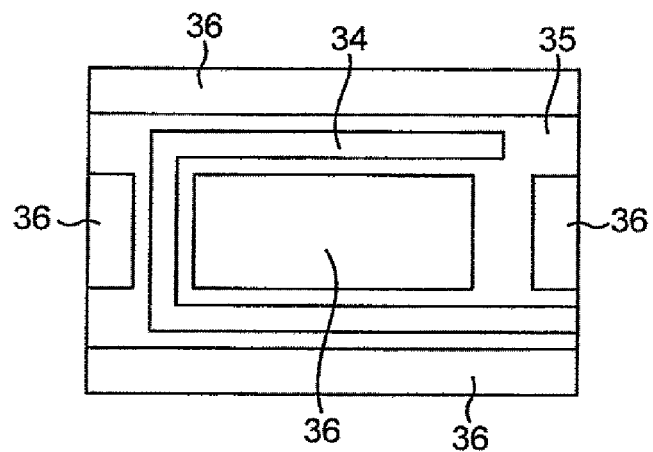
FIGS. 8A and 8B are plan views illustrating a method for manufacturing the coil array component according to an embodiment.

A conductor paste layer 34 is formed on the glass paste layer 32 by using the photolithography method. Specifically, the conductor paste layer 34 is formed by applying the photosensitive conductor paste, performing photo-curing through a mask, and performing development (FIG. 8A). The conductor paste layer 34 is formed inside the region of the glass paste layer 32 formed in advance. Subsequently, in the same manner as that described above, a glass paste layer 35 is formed in the periphery of the conductor paste layer 34 by applying the photosensitive glass paste, performing photo-curing through a mask, and performing development (FIG. 8A). At this time, the glass paste layer 35 is formed so as to overlap the edge portion of the conductor paste layer 34. Further, in the same manner as that described above, a shape-retaining paste layer 36 is formed in the periphery of the glass paste layer 35 by applying the shape-retaining photosensitive paste, performing photo-curing through a mask, and performing development (FIG. 8A). As the situation demands, the conductor paste layer 34, the glass paste layer 35, and the shape-retaining paste layer 36 having predetermined thicknesses may be formed by repeating this procedure.

Figure 8B:
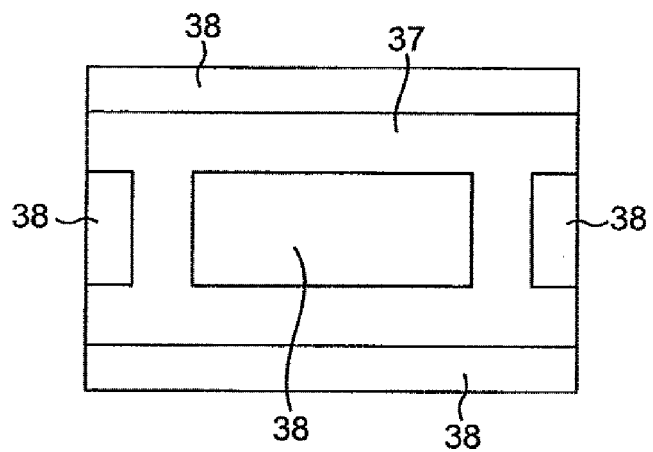

A glass paste layer 37 is formed on the conductor paste layer 34 by using the photolithography method. Specifically, the glass paste layer 37 is formed so as to cover the conductor paste layer 34 by applying the photosensitive glass paste, performing photo-curing through a mask, and performing development (FIG. 8B). Next, a shape-retaining paste layer 38 is formed of the shape-retaining photosensitive paste in the periphery of the glass paste layer 37 by using the photolithography method. Specifically, the shape-retaining paste layer 38 is formed in the periphery of the glass paste layer 37 by applying the shape-retaining photosensitive paste, performing photo-curing through a mask, and performing development (FIG. 8B). As the situation demands, the glass paste layer 37 and the shape-retaining paste layer 38 having predetermined thicknesses may be formed by repeating this procedure.

Figure 9A:
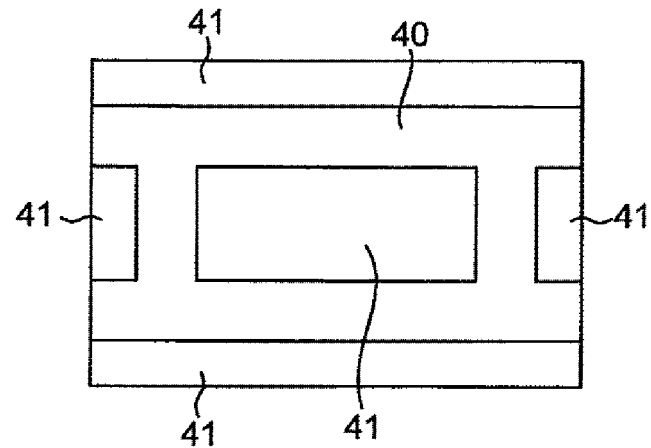
FIGS. 9A to 9C are plan views illustrating a method for manufacturing the coil array component according to an embodiment.

A ferrite paste layer 40 is formed on the glass paste layer 37 by using the photolithography method. Specifically, the ferrite paste layer 40 is formed so as to cover the glass paste layer 37 by applying the photosensitive ferrite paste, performing photo-curing through a mask, and performing development (FIG. 9A). Next, a shape-retaining paste layer 41 is formed of the shape-retaining photosensitive paste in the periphery of the ferrite paste layer 40 by using the photolithography method. Specifically, the shape-retaining paste layer 41 is formed in the periphery of the ferrite paste layer 40 by applying the shape-retaining photosensitive paste, performing photo-curing through a mask, and performing development (FIG. 9A). As the situation demands, the ferrite paste layer 40 and the shape-retaining paste layer 41 having predetermined thicknesses may be formed by repeating this procedure.

Figure 9B:
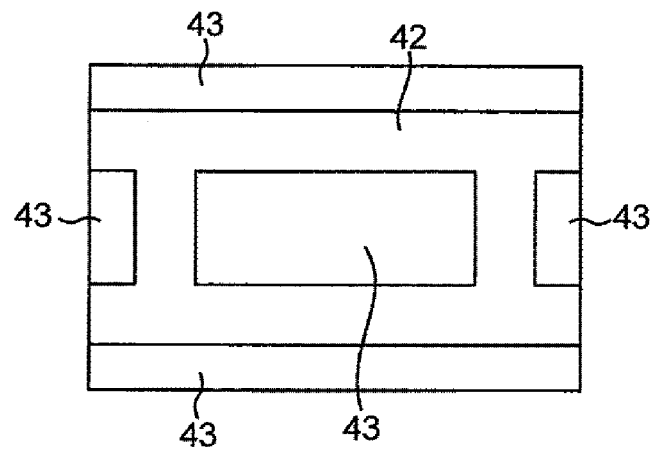
Figure 9C:
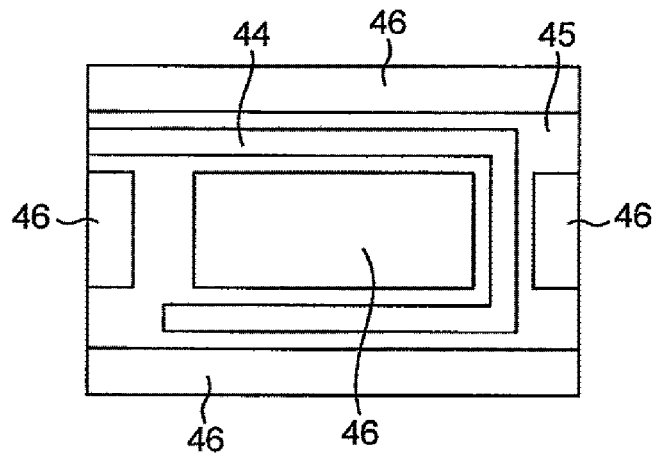

In the same manner as FIG. 6B, a glass paste layer 42 is formed on the ferrite paste layer 40, and a shape-retaining paste layer 43 is formed of the shape-retaining photosensitive paste in the periphery of the glass paste layer 42 (FIG. 9B). Further, in the same manner as FIG. 6C, a conductor paste layer 44 is formed on the glass paste layer 42, a glass paste layer 45 is formed in the periphery of the conductor paste layer 44, and a shape-retaining paste layer 46 is formed in the periphery of the glass paste layer 45 (FIG. 9C).

Figure 10A:
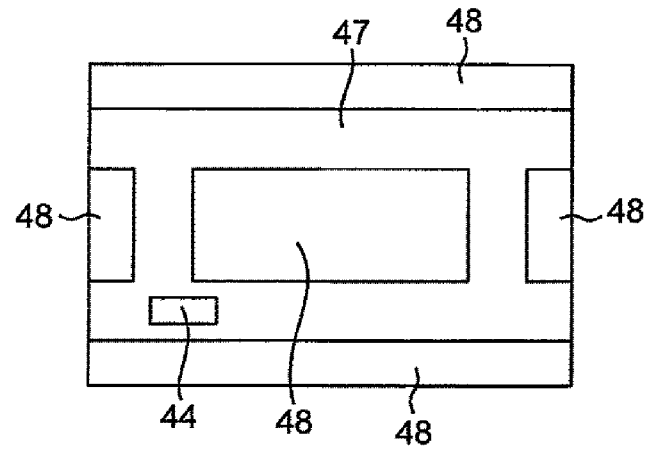
FIGS. 10A to 10C are plan views illustrating a method for manufacturing the coil array component according to an embodiment.
Figure 10B:
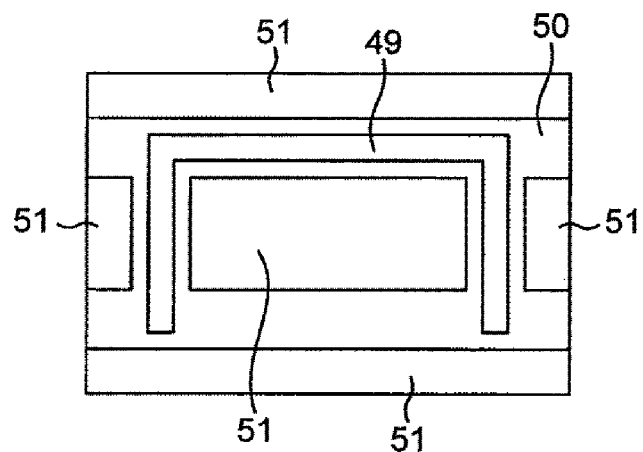
Figure 10C:
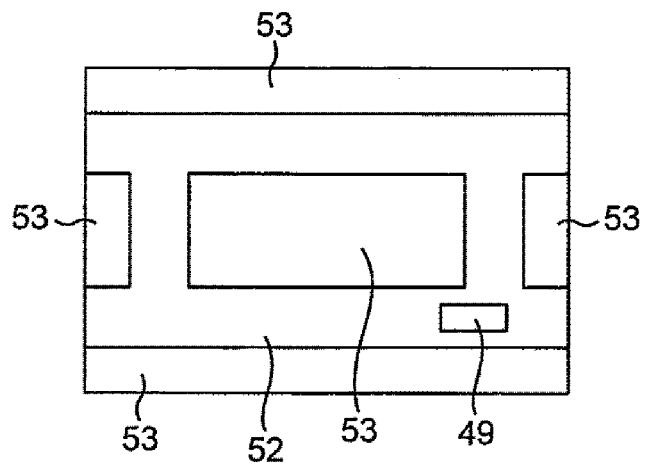

In the same manner as FIG. 7A, a glass paste layer 47 is formed on the conductor paste layer 44, and a shape-retaining paste layer 48 is formed in the periphery of the glass paste layer 47 (FIG. 10A). Further, in the same manner as FIG. 7B, a conductor paste layer 49 is formed on the glass paste layer 47, a glass paste layer 50 is formed in the periphery of the conductor paste layer 49, and a shape-retaining paste layer 51 is formed in the periphery of the glass paste layer 50 (FIG. 10B). Further, in the same manner as FIG. 7C, a glass paste layer 52 is formed on the conductor paste layer 49, and a shape-retaining paste layer 53 is formed in the periphery of the glass paste layer 52 (FIG. 10C).

Figure 11A:
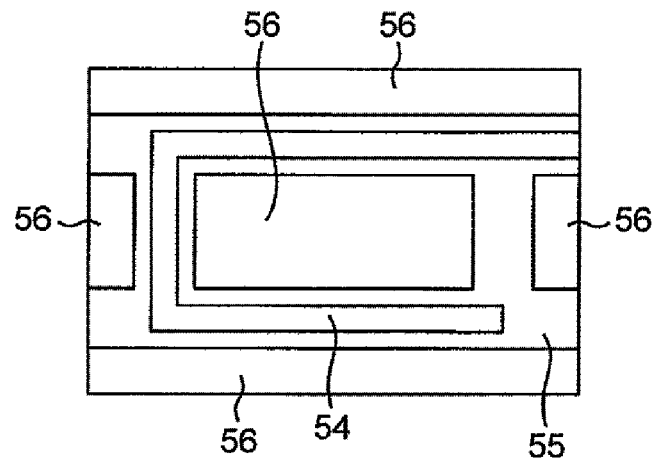
FIGS. 11A and 11B are plan views illustrating a method for manufacturing the coil array component according to an embodiment.

In the same manner as FIG. 8A, a conductor paste layer 54 is formed on the glass paste layer 52, a glass paste layer 55 is formed in the periphery of the conductor paste layer 54, and a shape-retaining paste layer 56 is formed in the periphery of the glass paste layer 55 (FIG. 11A).

Figure 11B:
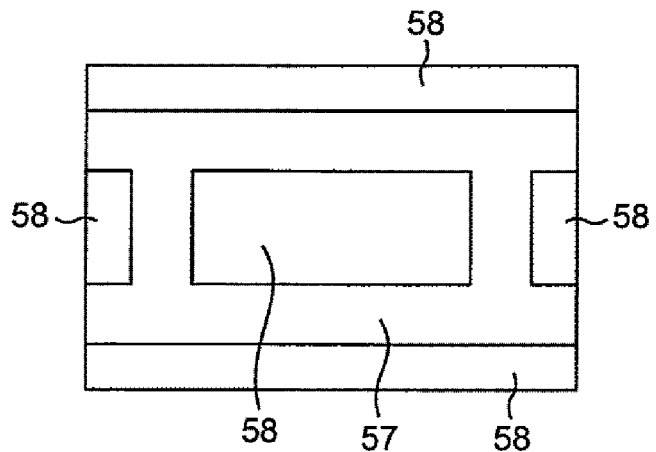

In the same manner as FIG. 8B, a glass paste layer 57 is formed on the conductor paste layer 54, and a shape-retaining paste layer 58 is formed in the periphery of the glass paste layer 57 (FIG. 11B).

A multilayer body is formed on the substrate as described above.

Figure 12A:
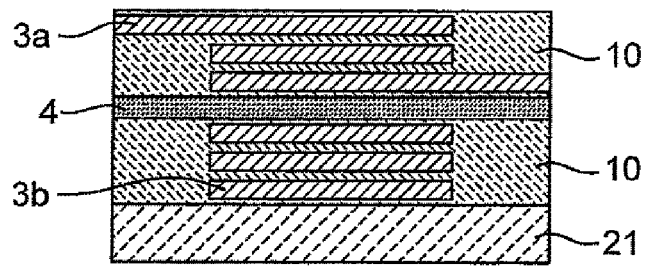
FIGS. 12A to 12D are sectional views, along line x-x, illustrating a method for manufacturing the coil array component according to an embodiment.
Figure 13A:
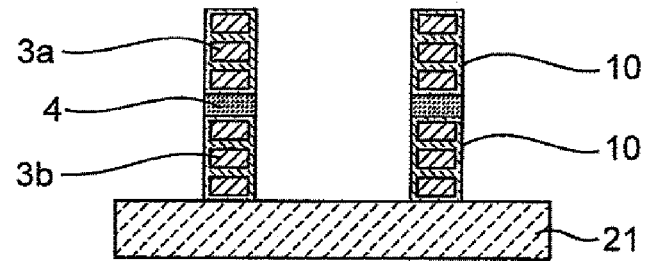
FIGS. 13A to 13D are sectional views, along line y-y, illustrating a method for manufacturing the coil array component according to an embodiment.
Figure 14A:
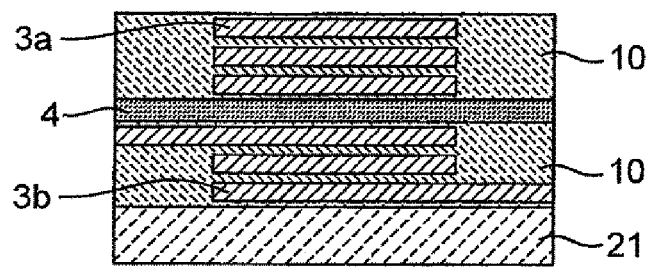
FIGS. 14A to 14D are sectional views, along line z-z, illustrating a method for manufacturing the coil array component according to an embodiment.

The resulting multilayer body is fired at a temperature of about 650° C. to 950° C. The organic material in the shape-retaining paste layer disappears during firing, and the inorganic material that does not sinter, for example, alumina, remains as powder without sintering. The first coil portion 3a and the second coil portion 3b covered with the glass layer 10 and the ferrite layer 4 disposed therebetween are obtained on the substrate by removing the inorganic material powder (FIG. 12A, FIG. 13A, and FIG. 14A). The first coil portion 3a and the second coil portion 3b covered with the glass layer 10 and the ferrite layer 4 disposed therebetween are integrally formed by firing, and the second coil portion 3b is in close contact with the substrate 21. Therefore, there are advantages in handling, for example, transportation.

Figure 12B:
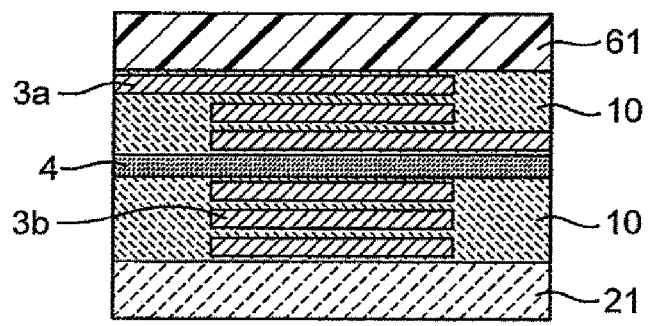
Figure 13B:
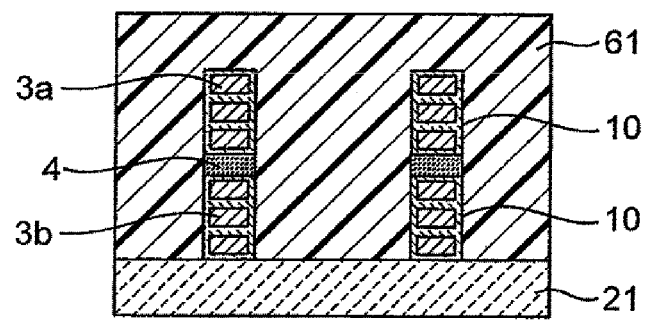
Figure 14B:
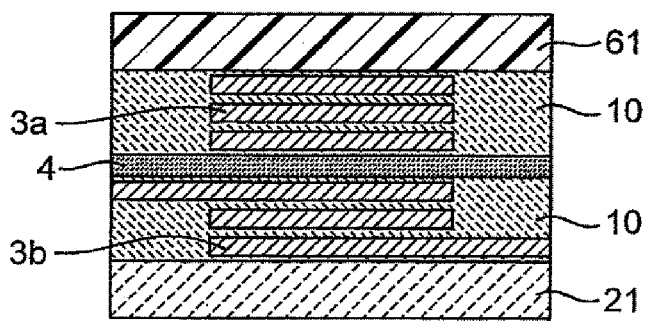

The magnetic sheet is pressed into the first coil portion 3a and the second coil portion 3b. A magnetic sheet 61 may be placed on the first coil portion 3a and pressurized by a die or the like so as to be pressed into the first coil portion 3a and the second coil portion 3b (FIG. 12B, FIG. 13B, and FIG. 14B).

Figure 12C:
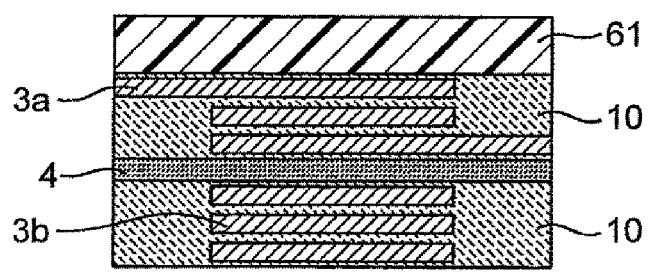
Figure 13C:
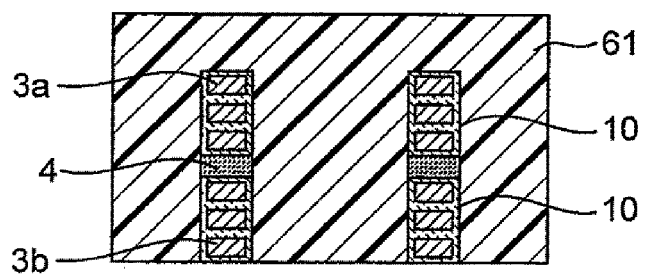
Figure 14C:
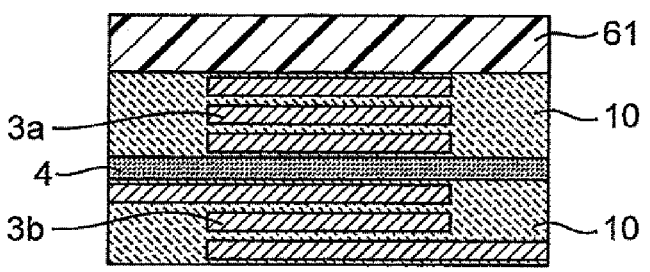

The substrate 21 is removed by grinding or the like (FIG. 12C, FIG. 13C, and FIG. 14C).

Figure 12D:
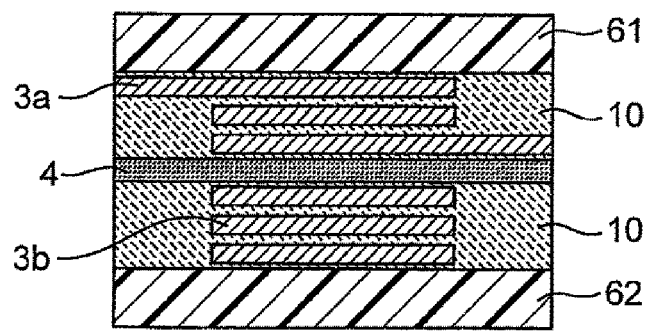
Figure 13D:
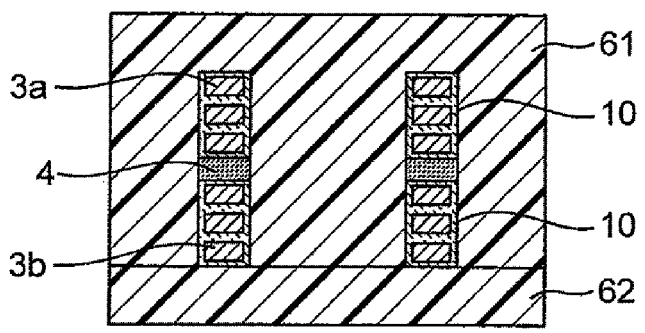
Figure 14D:
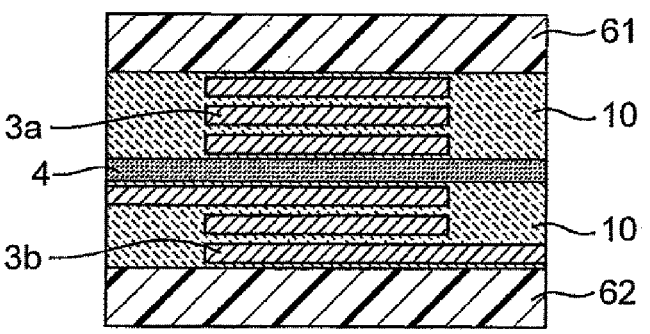

Another magnetic sheet 62 is made to come into close contact with the surface, from which the substrate 21 has been removed, by pressing or the like (FIG. 12D, FIG. 13D, and FIG. 14D). Thereafter, cutting is performed by a dicer or the like so as to separate the individual element assemblies from each other.

Figure 15A:
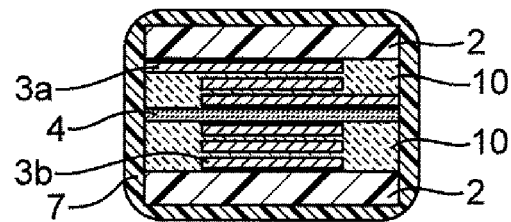
FIGS. 15A to 15E are sectional views, along line x-x, illustrating a method for manufacturing the coil array component according to an embodiment.

A protective layer 7 is formed on the entire surface of the resulting element assembly 2 (FIG. 15A). The protective layer may be formed by using a known method. For example, a method in which the element surface is covered by spraying an insulating material or a method in which dipping into an insulating material is performed may be used.

Figure 15B:
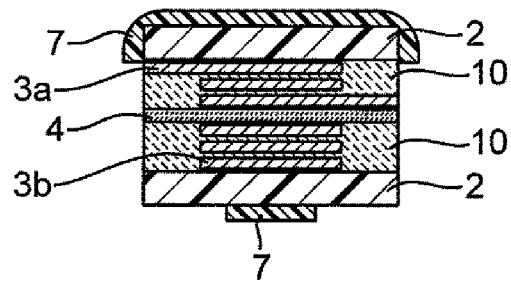

The protective layer 7 is removed from regions, in which the extension electrodes are to be formed, of the element assembly 2 (FIG. 15B). Removal may be performed by laser irradiation or a mechanical technique.

Figure 15C:
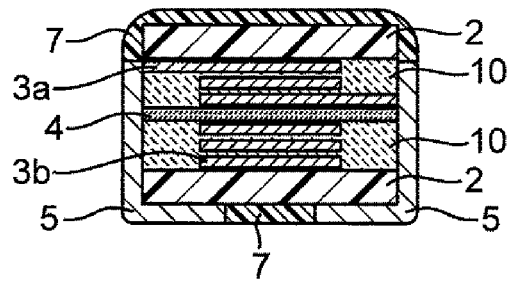
Figure 15D:
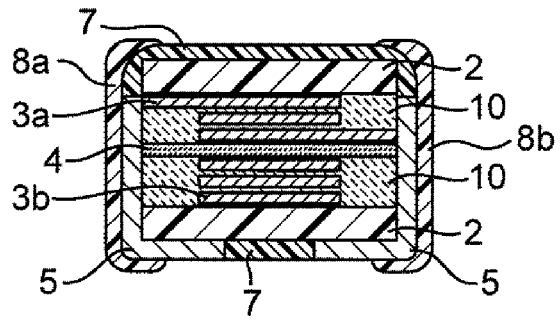
Figure 15E:
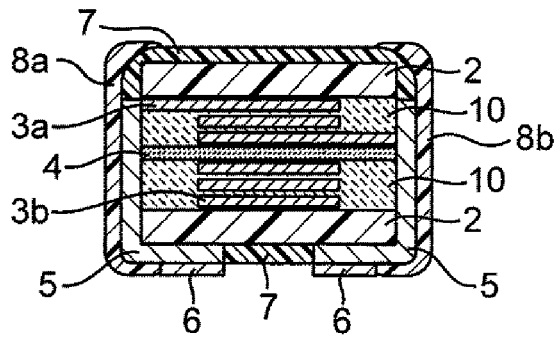

Extension electrodes 5 are formed (FIG. 15C). Insulating layers 8a and 8b are formed on the end surfaces of the element assembly (FIG. 15D). The insulating layer may be formed by using a known method. For example, a method in which the element surface is covered by spraying an insulating material or a method in which dipping into an insulating material is performed may be used. Finally, outer electrodes 6 are formed by plating or the like (FIG. 15E).

In this manner, the coil array component 1 according to an embodiment of the present disclosure is produced.

In the coil array component 1, the number of turns of each of the first coil portion 3a and the second coil portion 3b is 2.5. However, there is no particular limitation regarding the number of turns of the coil component according to the present disclosure. For example, the number of turns of the first coil portion can be increased by repeating the same steps as that shown in FIGS. 7A to 7C, and the number of turns of the second coil portion can be increased by repeating the same steps as that shown in FIGS. 10A to 10C.

The coil component according to the present disclosure and the method for manufacturing the same are as described above. However, the present disclosure is not limited to the above-described embodiments, and the design can be changed within the scope of the gist of the present disclosure.

EXAMPLES

Production of Magnetic Sheet

An Fe—Si-based alloy powder having the D50 (particle diameter at a cumulative percentage of 50% on a volume basis) of 5 μm was prepared. Regarding the alloy powder, about 50 nm of $SiO_2$ coating was formed on the powder surface in advance by a sol-gel method using tetraethyl orthosilicate (TEOS) as a metal alkoxide. A magnetic sheet was obtained by wet-mixing predetermined amounts of alloy powder and epoxy resin, forming the resulting mixture into a plurality of sheets (thickness of 100 μm) by a doctor blade method, and performing pressure bonding.

Production of Photosensitive Glass Paste

A borosilicate glass ($SiO_2$—$B_2O_3$—$K_2O$)-based glass powder having the D50 of 1 μm was prepared and mixed with a copolymer of methyl methacrylate and methacrylic acid (acrylic polymer), dipentaerythritol pentaacrylate (photosensitive monomer), dipropylene glycol monomethyl ether (solvent), 2,4-diethylthioxanthone, 2-methyl-1-[4-(methylthio)phenyl]-2-morpholinopropan-1-one, bis(2,4,6-trimethylbenzoyl)phenylphosphine oxide (photopolymerization initiator), and a dispersing agent so as to produce a photosensitive glass paste.

Photosensitive Conductor Paste

A Ag powder having the D50 of 2 μm was prepared and mixed with a copolymer of methyl methacrylate and methacrylic acid (acrylic polymer), dipentaerythritol pentaacrylate (photosensitive monomer), dipropylene glycol monomethyl ether (solvent), 2,4-diethylthioxanthone, 2-methyl-1-[4-(methylthio)phenyl]-2-morpholinopropan-1-one, bis(2,4,6-trimethylbenzoyl)phenylphosphine oxide (photopolymerization initiator), and a dispersing agent so as to produce a photosensitive conductor paste.

Shape-Retaining Photosensitive Paste

An alumina powder having the D50 of 10 μm was prepared and mixed with a copolymer of methyl methacrylate and methacrylic acid (acrylic polymer), dipentaerythritol pentaacrylate (photosensitive monomer), dipropylene glycol monomethyl ether (solvent), 2,4-diethylthioxanthone, 2-methyl-1-[4-(methylthio)phenyl]-2-morpholinopropan-1-one, bis(2,4,6-trimethylbenzoyl)phenylphosphine oxide (photopolymerization initiator), and a dispersing agent so as to produce a photosensitive alumina paste.

Photosensitive Ferrite Paste

Oxide powders of $Fe_2O_3$, NiO, ZnO, and CuO were weighed so as to fall within a predetermined composition, wet-mixed and pulverized sufficiently, dried, and calcined at a temperature of 750° C. A ferrite material powder was produced by performing wet pulverization such that the D50 became about 1.5 μm and performing drying. The resulting ferrite material powder was mixed with a copolymer of methyl methacrylate and methacrylic acid (acrylic polymer), dipentaerythritol pentaacrylate (photosensitive monomer), dipropylene glycol monomethyl ether (solvent), 2,4-diethylthioxanthone, 2-methyl-1-[4-(methylthio)phenyl]-2-morpholinopropan-1-one, bis(2,4,6-trimethylbenzoyl)phenylphosphine oxide (photopolymerization initiator), and a dispersing agent so as to produce a photosensitive ferrite paste.

Production of Coil Array Component

A substrate (ceramic sintered substrate having a thickness of 0.5 mm) was prepared (FIG. 6A). The photosensitive glass paste was applied to the substrate by screen printing and dried. Thereafter, ultraviolet rays were applied through a mask so as to perform photo-curing. An uncured portion was removed by a tetramethyl ammonium hydroxide (TMAH) aqueous solution serving as a developing solution so as to form a glass paste layer having a predetermined form. Subsequently, a photosensitive alumina paste was applied by printing, exposed, and developed in the same manner so as to form an alumina layer in the periphery of the glass layer (FIG. 6B).

The photosensitive conductor paste was applied by printing, exposed, and developed in the above-described manner so as to form a coil pattern having a predetermined form on the glass paste layer. The photosensitive glass paste was applied by coating, photo-cured through a mask, and developed so as to form a glass paste layer around the conductor layer (FIG. 6C). The photosensitive alumina paste was applied by coating and photo-cured through a mask so as to form an alumina layer in the periphery of the glass paste layer (FIG. 6C). This step was repeated two times so as to form the conductor paste layer.

The glass paste layer was formed by applying the photosensitive glass paste so as to expose the region serving as a connection portion of the conductor paste layer, performing photo-curing through a mask, and performing development (FIG. 7A). The photosensitive alumina paste was applied by coating and photo-cured through a mask so as to form an alumina layer in the periphery of the glass paste layer (FIG. 7A).

The photosensitive conductor paste was applied by printing, exposed, and developed in the above-described manner so as to form a coil pattern having a predetermined form on the glass paste layer (FIG. 7B). The photosensitive glass paste was applied by coating, photo-cured through a mask, and developed so as to form a glass paste layer around the conductor layer (FIG. 7B). The photosensitive alumina paste was applied by coating and photo-cured through a mask so as to form an alumina layer in the periphery of the glass paste layer (FIG. 7B). This step was repeated two times so as to form the conductor paste layer.

The glass paste layer was formed by applying the photosensitive glass paste so as to expose the region serving as a connection portion of the conductor paste layer, performing photo-curing through a mask, and performing development (FIG. 7C). The photosensitive alumina paste was applied by coating and photo-cured through a mask so as to form an alumina layer in the periphery of the glass paste layer (FIG. 7C).

The photosensitive conductor paste was applied by printing, exposed, and developed in the above-described manner so as to form a coil pattern having a predetermined form on the glass paste layer (FIG. 8A). The photosensitive glass paste was applied by coating, photo-cured through a mask, and developed so as to form a glass paste layer around the conductor layer (FIG. 8A). The photosensitive alumina paste was applied by coating and photo-cured through a mask so as to form an alumina layer in the periphery of the glass paste layer (FIG. 8A). This step was repeated two times so as to form the conductor paste layer.

The photosensitive glass paste was applied by coating, photo-cured through a mask, and developed in the above-described manner so as to form a glass paste layer (FIG. 8B). The photosensitive alumina paste was applied by coating and photo-cured through a mask so as to form an alumina layer in the periphery of the glass paste layer (FIG. 8B).

The ferrite layer was formed on the glass paste layer obtained as described above by applying the photosensitive ferrite paste by printing, performing photo-curing, and performing development (FIG. 9A).

Thereafter, in the above-described operations, the conductor paste layer, the glass paste layer, and the alumina layer having predetermined forms were formed (FIGS. 9B and 9C, FIGS. 10A to 10C, and FIGS. 11A and 11B).

A multilayer body composed of the conductor paste layers and the glass paste layers supported by the shape-retaining paste layers was obtained on the substrate by the above-described steps.

The multilayer body obtained as described above was fired at 700° C. The metal of the conductor paste layer and the glass of the glass paste layer sintered during the firing so as to become the coil conductor and the glass layer, respectively. Meanwhile, alumina of the alumina layer (shape-retaining paste layer) did not sinter and remained as an unsintered alumina powder. The alumina powder was removed, the surface was covered with a glass layer, and a coil component supported by the substrate was obtained (FIG. 12A, FIG. 13A, and FIG. 14A).

Next, a magnetic sheet was positioned on the side of the substrate where the coil portion was formed, a die was used for holding, and the magnetic sheet was pressed into the coil portion by being pressurized by a press (FIG. 12B, FIG. 13B, and FIG. 14B).

The substrate was removed by grinding (FIG. 12C, FIG. 13C, and FIG. 14C).

Another magnetic sheet was placed on the surface, from which the substrate had been removed, a die was used for holding, and the magnetic sheet was made to come into close contact with the surface by being pressurized by a press (FIG. 12D, FIG. 13D, and FIG. 14D).

Thereafter, cutting was performed by a dicer so as to separate the individual elements from each other.

A protective layer was formed on the element surface by spraying an epoxy resin while shaking the resulting element and, thereafter, performing heat-curing (FIG. 15A).

The protective layer was removed from regions, in which the extension electrodes were to be formed, of the element assembly by laser irradiation (FIG. 15B). Thereafter, extension electrodes were formed by depositing a Cu coating on an exposed portion by electroplating (FIG. 15C).

Subsequently, side insulating layers were formed by dipping the end surfaces of the element into an epoxy resin such that the Cu coating was covered except regions, in which the outer electrodes were to be formed, and performing heat curing (FIG. 15D).

Finally, a Ni coating and a Sn coating were sequentially formed in the regions, in which the outer electrodes were to be formed, by electroplating, (FIG. 15E).

In this manner, the coil array component was obtained. The resulting coil array component had a length (L) of 2.0 mm, a width (W) of 1.25 mm, and a height (T) of 0.6 mm. The thickness of the coil conductor was 50 µm, the width of the coil conductor was 270 µm, and the thickness of the glass layer was 15 µm. The thickness of the ferrite layer was 60 µm.

The coil array component according to the present disclosure may be widely used for various applications, for example, inductors.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A coil array component comprising:
an element assembly that includes a filler and a resin material;
a first coil portion and a second coil portion that are embedded in the element assembly and that are composed of a first coil conductor and a second coil conductor, respectively;
four outer electrodes present only at a bottom surface of the element assembly and electrically connected to the first coil portion and the second coil portion;
four extension electrodes that extend from end surfaces of the element assembly to the bottom surface of the element assembly and that are electrically connected to the outer electrodes on the bottom surface are further included; and
insulating layers on the end surfaces of the element assembly that cover the extension electrodes.

2. The coil array component according to claim 1, wherein the first coil portion and the second coil portion are arranged in two steps in a coil axis direction.

3. The coil array component according to claim 1, wherein each of the extension electrodes includes a Cu plating layer.

4. The coil array component according to claim 1, wherein each of the outer electrodes includes a Ni plating layer and a Sn plating layer.

5. The coil array component according to claim 1, wherein each of the insulating layers extends from a respective one of the end surfaces of the element assembly to four surfaces adjacent to the respective one of the end surfaces.

6. The coil array component according to claim 1, wherein the first coil conductor and the second coil conductor are covered with a glass layer.

7. The coil array component according to claim 1, wherein a ferrite layer is arranged between the first coil portion and the second coil portion.

8. The coil array component according to claim 1, wherein the coil conductor is fired and the element assembly is not fired.

9. The coil array component according to claim 2, wherein each of the extension electrodes includes a Cu plating layer.

10. The coil array component according to claim 2, wherein each of the outer electrodes includes a Ni plating layer and a Sn plating layer.

11. The coil array component according to claim 3, wherein each of the outer electrodes includes a Ni plating layer and a Sn plating layer.

12. The coil array component according to claim 2, wherein each of the insulating layers extends from a respective one of the end surfaces of the element assembly to four surfaces adjacent to the respective one of the end surfaces.

13. The coil array component according to claim 3, wherein each of the insulating layers extends from a respective one of the end surfaces of the element assembly to four surfaces adjacent to the respective one of the end surfaces.

14. The coil array component according to claim 4, wherein each of the insulating layers extends from a respective one of the end surfaces of the element assembly to four surfaces adjacent to the respective one of the end surfaces.

15. The coil array component according to claim 2, wherein the first coil conductor and the second coil conductor are covered with a glass layer.

16. The coil array component according to claim 3, wherein the first coil conductor and the second coil conductor are covered with a glass layer.

17. The coil array component according to claim 2, wherein a ferrite layer is arranged between the first coil portion and the second coil portion.

18. The coil array component according to claim 3, wherein a ferrite layer is arranged between the first coil portion and the second coil portion.

19. The coil array component according to claim 2, wherein the coil conductor is fired and the element assembly is not fired.

20. The coil array component according to claim 3, wherein the coil conductor is fired and the element assembly is not fired.

* * * * *